(12) United States Patent
Asam et al.

(10) Patent No.: US 10,224,919 B2
(45) Date of Patent: Mar. 5, 2019

(54) POWER SWITCH CONTROL BY SUPPLY VOLTAGE TERMINAL

(71) Applicant: Infineon Technologies AG, Neubiberg (DE)

(72) Inventors: Michael Asam, Sainbach (DE); Carmelo Giunta, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/425,599

(22) Filed: Feb. 6, 2017

(65) Prior Publication Data

US 2018/0226963 A1    Aug. 9, 2018

(51) Int. Cl.
*H03K 17/06*    (2006.01)
*H03K 17/284*    (2006.01)

(52) U.S. Cl.
CPC ......... *H03K 17/063* (2013.01); *H03K 17/284* (2013.01); *H03K 2217/0027* (2013.01)

(58) Field of Classification Search
CPC .... H03K 5/08; H03K 17/692; H03K 17/6871; H03K 17/74; H03K 17/691; H03K 19/0013
USPC .................. 327/108, 109, 110, 111, 112
See application file for complete search history.

(56) References Cited

U.S. PATENT DOCUMENTS

| 6,700,432 | B2 | 3/2004 | Misdom et al. |
| 8,222,928 | B2 * | 7/2012 | Bayerer ............... H03K 17/567 327/108 |
| 2013/0249602 | A1 * | 9/2013 | Mauder ............... H01L 29/7801 327/108 |

FOREIGN PATENT DOCUMENTS

DE    60129778 T2    6/2008

OTHER PUBLICATIONS

Office Action, in the German language, from counterpart German Application No. 102018102341.3, dated Oct. 9, 2018, 7 pages.

* cited by examiner

*Primary Examiner* — John W Poos
(74) *Attorney, Agent, or Firm* — Shumaker & Sieffert, P.A.

(57) ABSTRACT

A power switch device includes a switch which is configured to switch a load signal between an on state and an off state. A first terminal and a second terminal of the power switch device are configured to provide a supply voltage to the power switch device. The second terminal is further configured to provide a control signal to the power switch device. The control signal is generated by disconnecting the second terminal from an external voltage source. A storage circuit of the power switch device is configured to capacitively store a status of the supply voltage. A control circuit of the power switch device is configured to control operation of the power switch device depending on the stored status of the supply voltage.

20 Claims, 6 Drawing Sheets

POWER SWITCH CONTROL BY SUPPLY VOLTAGE TERMINAL

TECHNICAL FIELD

The present application relates to a power switch device and to a method of operating a power switch device.

BACKGROUND

For various kinds of applications, it is known to utilize power switch devices. For example in the automotive field, power switch devices may be utilized for switching signals with large value of electric current, e.g., in the range of 1 A or more.

For various reasons, it is desirable to build such power devices as a semiconductor device package with a low pin count. A low pin count may help to achieve good thermal and electrical performance while maintaining low production costs. One way to limit the pin count is to omit a dedicated ground pin and implement the power switch device as a current controlled device. In such current controlled device, switching to an on state, where a load current can pass through the power switch device, is achieved by externally connecting a control input pin of the power switch device to ground. In this state, the control input pin also acts as a ground connection of the power switch device. Switching to an off state, where the load current cannot pass through the power switch device, is achieved by disconnecting the control input pin from ground, which at the same time leaves the power switch device without supply voltage.

However, the above way of using a current controlled implementation without a dedicated ground pin may have the effect that the power switch device might not be able to distinguish between intentional switching to the off state and sudden drops of the supply voltage, for example due to short-circuiting of a load connected to the power switch device. This may limit operability and functionality of the power switch device.

Accordingly there is a need for techniques which allow for efficiently operating a power switch device without requiring excessive amounts of terminals on the power switch device.

SUMMARY

According to an embodiment, a power switch device is provided. The power switch device comprises a switch which is configured to switch a load signal between an on state and an off state. Further, the power switch device comprises a first terminal and a second terminal which are configured to provide a supply voltage to the power switch device. The second terminal is further configured to provide a control signal to the power switch device. The control signal is generated by disconnecting the second terminal from an external voltage source. Further, the power switch device comprises a storage circuit. The storage circuit is configured to capacitively store a status of the supply voltage. Further, the power switch device comprises a control circuit. The control circuit is configured to control operation of the power switch device depending on the stored status of the supply voltage.

According to a further embodiment, a method of operating a power switch device is provided. According to the method, a power switch device switches a load signal between an on state and an off state. A supply voltage is provided via a first terminal and a second terminal of the power switch device to the power switch device. Further, a control signal is provided to the power switch device. The control signal is generated by disconnecting the second terminal from an external voltage source. A status of the supply voltage is capacitively stored. Operation of the power switch device is controlled depending on the stored status of the supply voltage.

According to further embodiments of the invention, other devices or methods may be provided. Such embodiments will be apparent from the following detailed description in connection with the accompanying drawings.

DETAILED DESCRIPTION

Figure 1:
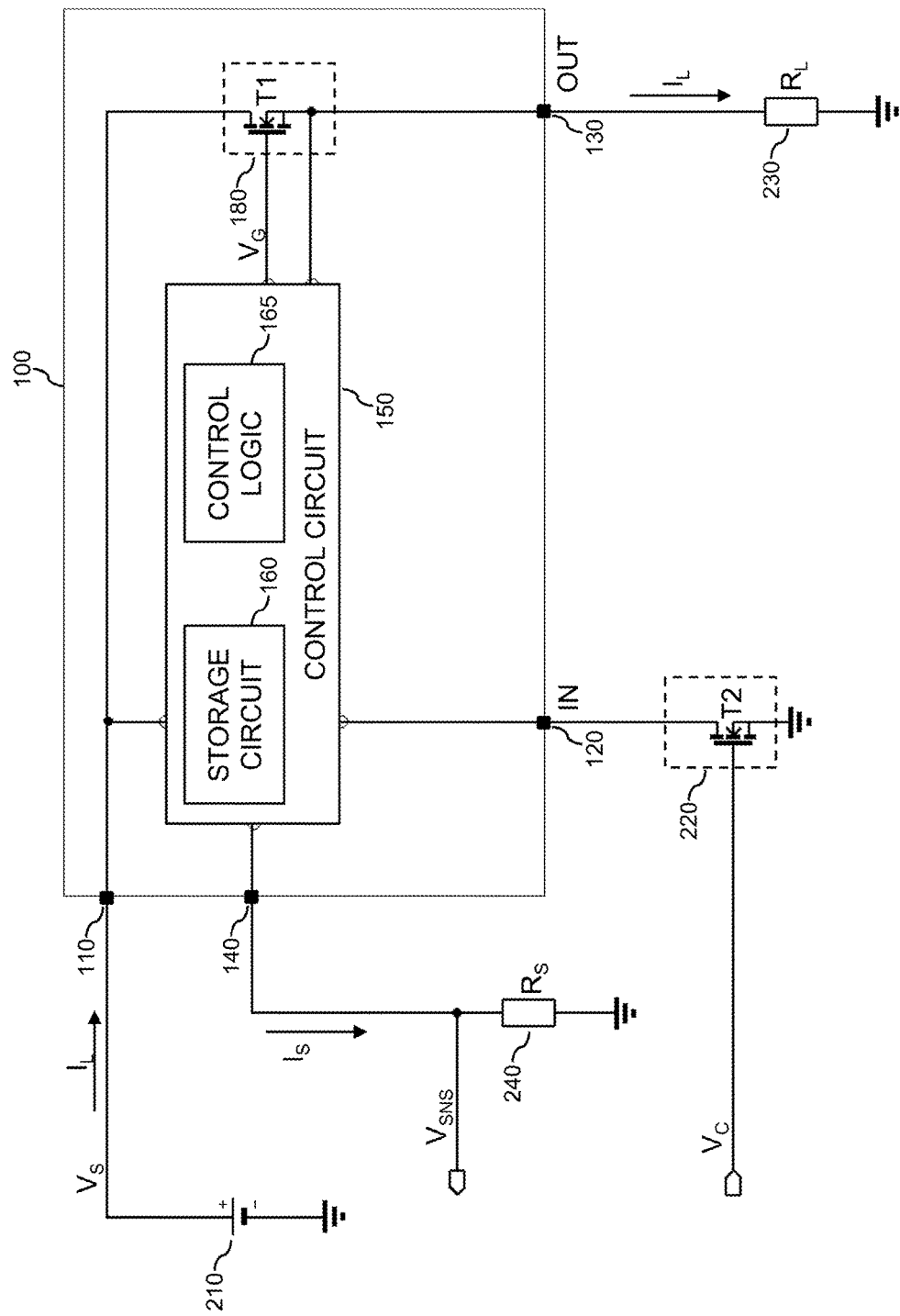
FIG. 1 schematically illustrates a circuit with a power switch device according to an embodiment of the invention.

In the following, various embodiments will be described in detail with reference to the accompanying drawings. It should be noted that these embodiments serve only as examples and are not to be construed as limiting. For example, while embodiments with a plurality of features, other embodiments may comprise less features and/or alternative features. Furthermore, features from different embodiments may be combined with each other unless specifically noted otherwise.

Embodiments as illustrated in the following relate to power switch devices and methods of operating such power switch devices. The power switch devices as illustrated herein may for example be utilized in the automotive field, e.g., for controlling charging or discharging of a battery or for controlling supply of electrical current to a motor. However, it is noted that the illustrated power switch devices could also be utilized in various other fields, such as photovoltaic systems or in industrial manufacturing systems.

In the illustrated examples, a power switch device is used for switching a load signal, e.g., a load current, between an "on state" and an "off state". In the on state, the load signal can pass through the power switch device. In the off state, passage of the load signal through the power switch device is blocked. The load signal may have a high value of electrical current, e.g., in the range of 1 A or more, typically in the range of 5 A or more. The power switch device has a first and a second terminal, e.g., first and second pins of a semiconductor electronics package, to provide a supply voltage to the power switch device. For example, the first terminal may electrically connect the power switch device to a positive external supply voltage, and the second terminal may electrically connect the power switch device to ground. However, other assignments of the first and second terminals to external voltage levels are possible as well. For example, the first terminal could electrically connect the power switch device to a negative external supply voltage, and the second terminal could electrically connect the power switch device to ground. Further, the first terminal could electrically connect the power switch device to a positive external supply voltage, and the second terminal could electrically connect the power switch device to a negative external supply voltage. The second terminal is further used as a control input of the power switch device. In response to connecting the second terminal to its associated external voltage level, the power switch device switches its load signal to the on state. This may for example involve closing a transistor based switch of the power switch device. In response to disconnecting the second terminal from its associated external voltage level, the power switch device switches its load signal to the off state, e.g., by opening the above-mentioned transistor based switch of the power switch device. Accordingly, the power switch device is controlled by one of its supply voltage terminals.

In order to enhance control functionalities of the power switch device, the power switch device is further configured to capacitively store a status of its supply voltage. This may be achieved by charging a capacitor while the second terminal is connected to its associated external voltage level and discharging a capacitor while the second terminal is disconnected from its associated external voltage level. The charge stored in the capacitor at the time when the second terminal is again connected to its associated external voltage level may thus be used as a basis for estimating duration of a time period for which the second terminal was disconnected from its associated external voltage level. This may in turn allow for distinguishing intended switching events and unintended drops of the supply voltage. Moreover, the duration of the time period for which the second terminal was disconnected from its associated external voltage level may also be used for indicating other control information to the power switch device. For example, a certain duration of the time period for which the second terminal was disconnected from its associated external voltage level may trigger the power switch device to change between different modes of operation.

FIG. 1 schematically illustrates a power switch device 100 according to an embodiment. In the illustrated example, the power switch device 100 is formed as an integrated circuit package having a total number of four external connection pins 110, 120, 130, 140. However, it is noted that in other implementations the total number of external connection pins could be higher, e.g., five or more, and lower, e.g. three or less. The external connection pins 110, 120, 130, 140 are assumed to be configured for electrically and mechanically connecting the integrated circuit package of the power switch device 100 to a printed circuit board, e.g., by soldering or by inserting the connection pins into a corresponding socket on the printed circuit board. However, it is noted that other types of terminals could be used on the integrated circuit package of the power switch device 100, e.g., various types of connection leads or pads. Moreover, it is to be understood that various integrated circuit package types could be used for the power switch device 100, including but not limited to: Dual In-Line Package (DIP), a Quad-In-Line-Package (QUIP), a Pin Grid Array (PGA) package, a Ball Grid Array (BGA) package, or a Land Grid Array (LGA) package.

A first connection pin 110 and a second connection pin 120 have the purpose of connecting the power switch device 100 to an external voltage source 210 and thereby provide a supply voltage to the power switch device 100. The external voltage source 210 may for example correspond to a battery. However, it is noted that other types of external voltage sources could be used as well, e.g., based on a mains adapter or the like. In the illustrated example, the first connection pin 110 connects the power switch device 100 to a positive external supply voltage level, denoted by $V_S$, while the second connection pin 120 connects the power switch device 100 to ground. However, it is noted that these external voltage levels are merely exemplary, and that other voltage levels could be used as well, such as a positive external supply voltage level and a negative external supply voltage level. Moreover, it is noted that the assignments of the first connection pin 110 to the above-mentioned external voltage levels and the second connection pin 120 could be swapped. In addition, the second connection pin 120 also serves as a control input of the power switch device 100. For providing control information to the power switch device 100, the second connection pin 120 is selectively disconnected from the external power supply 210. In the illustrated example, an external switch 220 is connected between the second connection pin 120 and ground and can be used to selectively disconnect the second connection pin 120 from ground. The external switch 220 is controlled by an external control signal, e.g., an external control voltage. In the illustrated example, the external switch 220 is formed by an MOS (Metal Oxide Semiconductor) transistor T2. However, it is noted that other implementations of the external switch 220 could be used as well, e.g., using other transistor types and/or more complex switch designs based on multiple transistors.

A third connection pin 130 has the purpose of connecting the power switch device 100 to an external load, in the illustrated example schematically represented by load resistor $R_L$. The external load could for example correspond to an electric motor or to a battery to be charged. A load signal, in the illustrated example represented as a load current $I_L$, may pass through the power switch device 100 and the external load. By means of the power switch device 100, the load signal can be switched between the on state and the off state. For this purpose, the power switch device 100 is provided with a switch 180. In the illustrated example, the switch 180 is formed by an enhancement mode n-channel MOS transistor T1 connected with its source and drain terminals between the first connection pin 110 and the third connection pin 130. Accordingly, the flow of the load current $I_L$ can be activated by applying a sufficiently high gate voltage $V_G$ to a gate terminal of the MOS transistor T1. If no gate voltage $V_G$ is applied to the gate terminal, the MOS transistor T1 will block the flow of the load current $I_L$. It is noted that the illustrated implementation of the switch 180 is merely exemplary and that other implementations of the switch 180 could be used as well. For example, the switch 180 could be formed of multiple transistors and/or other transistor types could be used in addition or as an alternative, such as an enhancement mode p-channel MOS transistor, a combination of an n-channel MOS transistor and a p-channel MOS transistor, or other types of field effect transistors. Still further, it is noted that the power switch device 100 could also include multiple switches for switching multiple load signals between the on state and the off state, in a similar manner as explained for the switch 180. These multiple load signals could for example be supplied to multiple external loads, each connected via a corresponding connection pin of the power switch device.

A fourth connection pin 140 has the purpose of supporting a current sense functionality of the power switch device 100. The current sense functionality may for example allow for measuring the value of the load current $I_L$ through the power switch device 100. In the illustrated example, the current sense functionality may be implemented by outputting a sense current $I_S$, which is proportional to the load current $I_L$, through the fourth connection pin 140. By feeding this sense current through an external sense resistor $R_S$, the sense current $I_S$ may be converted to a corresponding sense voltage $V_{SNS}$.

The gate voltage $V_G$ for the switch 180 is generated by a control circuit 150 of the power switch device 100. In the illustrated example, the control circuit 150 includes a storage circuit 160 and a control logic 165. The control logic 165 is responsible for controlling operation of the switch 180 by generating the gate voltage $V_G$. This is accomplished in accordance with the control information provided through the second connection pin 120. When the second connection pin 120 is disconnected from ground, this has the effect that the power switch device 100 is no longer with its supply voltage. In this case, also the control logic 165 will no longer be powered and the gate voltage $V_G$ applied to the switch 180 will fade, causing the switch 180 to open and bringing the load signal to the off state. If the second connection pin 120 is reconnected to ground, the power switch device 100 is again supplied with power from the external voltage source 210, and also the control logic 165 becomes operative again. In this situation, the control logic 165 may decide to generate the gate voltage $V_G$ with a sufficiently high value so that the switch 180 is opened, bringing the load signal to the on state.

Further, the control circuit 150 may implement fault detection and protective mechanisms. In particular, the control circuit 150 may be configured to detect fault events and adapt the control of the gate voltage voltage $V_G$ in response to detecting a fault event. A typical example of such fault event is an overcurrent of the load signal, e.g., as caused by short circuiting of the load. As a protective measure, the control circuit 150 may be configured to open the switch 180 when detecting a fault event. This may involve actively discharging the gate of the MOS transistor T1. Here, it is noted that by for example using depletion mode MOS transistors, the control circuit 150 may be configured to perform such discharging of the gate of the MOS transistor T1 even when there is a loss of the supply voltage.

In the illustrated power switch device 100 the decision of the control logic 165 to open the switch 180 not only depends on the second connection pin 120 being connected to ground, but also on other criteria, in particular a status of the supply voltage of the power switch device 100 as capacitively stored in the power switch device 100. For capacitively storing the status of the supply voltage, the power switch device 100 includes the storage circuit 160. As explained in more detail below, the storage circuit 160 may operate by charging a capacitor while the supply voltage is present and discharging the capacitor while the supply voltage is not present. By detecting the charge in the capacitor when the power switch device 100 is again provided with its supply voltage it is thus possible to assess a time duration for which the power switch device 100 was not sufficiently powered. This in turn enables distinguishing between events where the second connection pin 120 was intentionally disconnected from ground, e.g., in order to bring the load signal to the off state or to indicate certain control information to the power switch device 100, and other events involving an unintentional drop of the supply voltage, e.g., due to accidental short-circuiting of the load connected to the power switch device. Here, it may be utilized that time periods of intentionally disconnecting the second connection pin 120 from ground may be designed in such a way that they differ from typical durations of voltage drops which may occur in the system. By way of example, a time period associated with intentional disconnecting of the second connection pin 120 from ground in order to bring the load signal to the off state could be defined to at least 1 s. During that time, the capacitively stored status of the supply voltage will have dropped below a threshold, which can then be detected by the control logic 165 when the power switch device 100 is again provided with its supply voltage. As compared to that, a typical accidental drop of the supply voltage may be shorter than 1 s, which means that the capacitively stored status of the supply voltage is still above the threshold when the supply voltage recovers from the drop, which can also be detected by the control logic 165 when the power switch device 100 is again provided with its supply voltage. Accordingly, based on the capacitively stored status of the supply voltage, the control logic 165 can distinguish between intentional disconnecting of the second connection pin 120 from ground, so as to control operation of the power switch device 100, and other events involving accidental temporary drops of the supply voltage.

In addition to the status of the supply voltage as stored by the storage circuit 160, the control logic 165 may also consider a voltage stored in the gate of the MOS transistor of the switch 180. As mentioned above, when the power switch device 100 is no longer powered by the external voltage source 210, also the gate voltage $V_G$ generated by the control logic 165 will fade within a timescale which depends on a capacitance of the gate of the MOS transistor T1, e.g., on a gate-source capacitance of the MOS transistor T1. This timescale is typically relatively long, e.g., above 100 µs. Accordingly, the voltage stored by the gate of the MOS transistor may be used for detecting events where the second connection pin 120 was disconnected for a very short time period from ground. These kinds of events may be used for providing control information to the power switch device 100 while keeping the switch 180 closed and the load signal in the on state.

After the power switch device 100 experienced a loss of its supply voltage and at a time when the power switch device 100 is then again provided with its supply voltage, the control logic 165 may utilize the capacitively stored status of the supply voltage and the voltage stored by the gate of the transistor T1 for distinguishing between different cases which will be further explained in the following.

According to a first case, the capacitively stored status of the supply voltage is below a first threshold and the voltage stored by the gate of the transistor T1 is below a second threshold, which means that the loss of the supply voltage was longer than a first time duration and also longer than a second time duration. The first time duration may be regarded as a lifetime of capacitively storing the status of the supply voltage and may be in the range of 50 µs to 100 µs. The second time duration may be regarded as a lifetime of keeping the gate voltage $V_G$ of the MOS transistor T1 at a sufficient level to keep the switch 180 closed. The second time duration may be in the range of 100 µs to 200 µs. The control logic 165 may interpret the observations of the first case as being indicative of intentional reconnecting the second connection pin 120 to ground, to thereby switch the load signal from the off state to the on state. As a result, the control logic 165 may generate the gate voltage $V_G$ as required to close the switch 180.

According to a second case, the capacitively stored status of the supply voltage is above the first threshold and the voltage stored by the gate of the MOS transistor T1 is below the second threshold, which means that the supply voltage was still present at a time which is no longer past than the first time duration and that the gate of the MOS transistor T1 was discharged by the control circuit 150 in response to detecting a fault event, such as an overcurrent due to short circuiting of the load. The control logic 165 may interpret the observations of the second case as being indicative of an unintentional drop of the supply voltage. As a result, the control logic 165 may initiate protective and/or diagnostic measures. Further, the control logic 165 may generate the gate voltage $V_G$ as required to close the switch 180. As compared to the scenario of the first case, this may be accomplished in a delayed manner and/or under the condition that the above-mentioned protective measures are in force and/or the above-mentioned diagnostic measures indicate that there is no persisting fault which would require keeping the load signal in the off state.

According to a third case, the capacitively stored status of the supply voltage is above the first threshold and the voltage stored by the gate of the MOS transistor T1 is above the second threshold, which means that the loss of the supply voltage was shorter than the first time duration. The control logic 165 may interpret the observations of the third case as being indicative of intentional short-time disconnecting of the second connection pin 120 from ground, to thereby indicate certain control information to the power switch device 100 while keeping the switch 180 closed. For example, the control information indicated to the power switch device 100 may have the purpose of switching the power switch device 100 between different modes of operation. Such modes of operation may for example include an operating mode where the above-mentioned current sense functionality via the fourth connection pin 140 is activated and an operating mode where the above-mentioned current sense functionality via the fourth connection pin 140 is deactivated. Further, the control information indicated to the power switch device 100 may have the purpose of temporarily switching the power switch device 100 to an idle mode where the switch 180 is open, i.e., the load signal is in the off state, while maintaining the supply voltage and thus keeping the control circuit 150 active, e.g., for certain internal diagnosis procedures performed by the control circuit 150.

It is noted that the above-mentioned three cases which can be distinguished by the control logic 165 are merely exemplary. By way of example, additional cases could be distinguished by defining further time durations in addition to the above-mentioned first time duration and second time duration. For example, selection between more than two different modes of operation of the power switch device 100 could be implemented by distinguishing between different times of intentional short-time disconnecting of the second connection pin 120 from ground and these different times may be distinguished based on the capacitively stored status of the supply voltage and/or based on the voltage stored by the gate of the MOS transistor T1.

Figure 2:
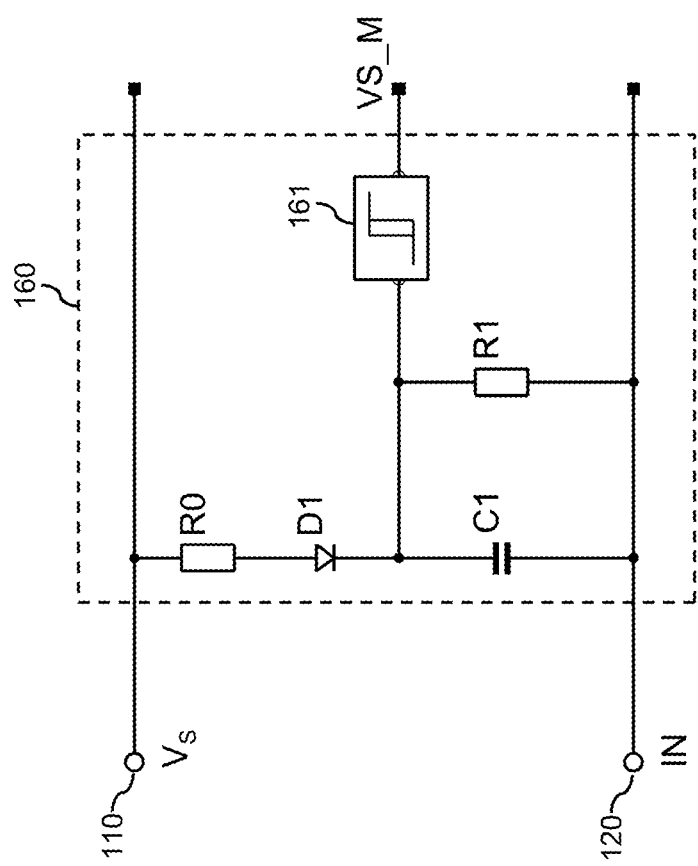
FIG. 2 schematically illustrates an example of a storage circuit as used in a power switch device according to an embodiment of the invention.

FIG. 2 schematically illustrates an example of a storage circuit 160 which may be used in the above-mentioned power switch device 100 for capacitively storing the status of the supply voltage. As can be seen, in this example the storage circuit 160 includes a capacitor C1 and a resistor R1 which form an RC-circuit. The resistance value $R_1$ of the resistor R1 and the capacitance value $C_1$ of the capacitor C1 define a time constant $$\tau_1 = R_1 \cdot C_1. \tag{1}$$

In addition, the storage circuit 160 includes a further resistor R0, a diode D1, and a comparator circuit, which in the illustrated example is implemented as a Schmitt trigger circuit 161. The resistor R0, the diode D1, and the capacitor C1 are connected in series between the first connection pin 110 and the second connection pin 120. The resistor R1 is connected in parallel to the capacitor C1.

While the second connection pin 120 is connected to ground, the capacitor C1 is charged by the supply voltage $V_S$. In this state, a charging current of the capacitor C1 is limited by the resistor R0. During a loss of the supply voltage $V_S$, the capacitor C1 is discharged through the resistor R1. The diode D1 prevents discharging of the capacitor C1 through other circuit paths. Assuming that the capacitor was fully charged to $V_S$, the time-dependent voltage of the capacitor C1 is then given by $$V_{C1}(t) = V_S \cdot e^{-t/\tau_1}. \tag{2}$$

Accordingly, by measuring the time dependent voltage across the capacitor C1, the duration of the loss of the supply voltage can be estimated. In the case of the storage circuit 160, the voltage across the capacitor C1 at the time when the supply voltage returns is detected by the Schmitt trigger circuit 161. The Schmitt trigger circuit 161 compares the voltage across the capacitor C1 to the above-mentioned first threshold and, depending on the comparison, outputs a status signal VS_M. If the voltage across the capacitor C1 is above the first threshold, the status signal VS_M has a high value. Otherwise, the status signal VS_M has a low value.

Figure 3:
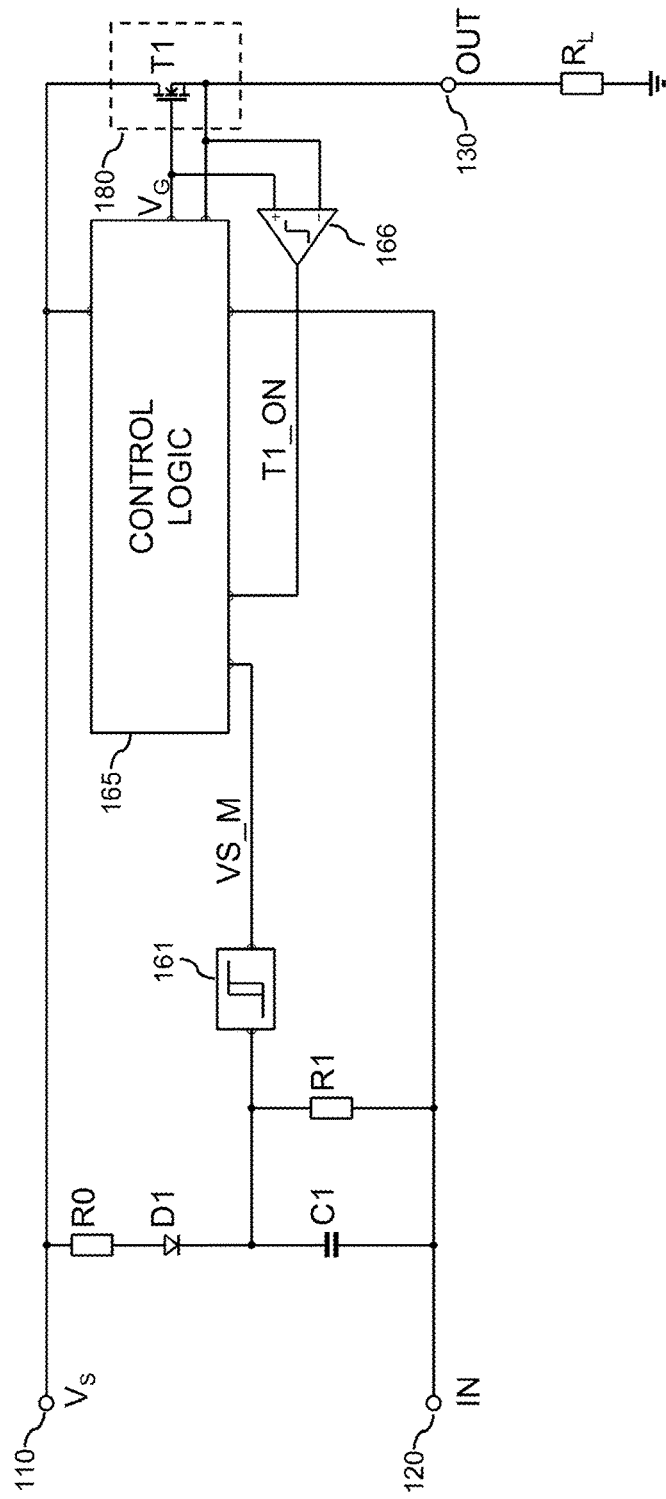
FIG. 3 schematically illustrates an example of an overall circuit of a power switch device according to an embodiment of the invention.

FIG. 3 schematically illustrates circuitry of the power switch device 100 and the storage circuit 160. As illustrated, the status signal VS_M is provided as one input to the control logic 165. As further illustrated, the power switch device 100 further includes a comparator 166 for detecting the voltage stored by the gate of the MOS transistor T1. In the illustrated example, the comparator 166 compares the voltage difference between the gate and the source of the MOS transistor T1 to the second threshold. The second threshold may for example be selected slightly above a threshold voltage of the MOS transistor T1. The comparator 166 outputs a further status signal T1_ON. If the voltage stored by the gate of the MOS transistor T1 is above the second threshold, the further status signal T1_ON has a high value. Otherwise, the further status signal T1_ON has a low value. When the supply voltage returns after a loss, the control logic may thus accomplish the above-mentioned evaluations based on the value of the status signal VS_M and the value of the further status signal T1_ON, using the following control rules: 1) If the value of the status signal VS_M is low and the value of the further status signal T1_ON is low, control operation of the power switch device 100 according to a rule for normal switching from off state to on state. 2) If the value of the status signal VS_M is high and the value of the further status signal T1_ON is low, control operation of the power switch device 100 according to rule for switching to on state after supply voltage drop. 3) If the value of the status signal VS_M is high and the value of the further status signal T1_ON is high, control operation of the power switch device 100 based on control information indicated by the short-time disconnecting of the second input pin 120 from ground, e.g., by triggering a change of operating mode.

Figure 4:
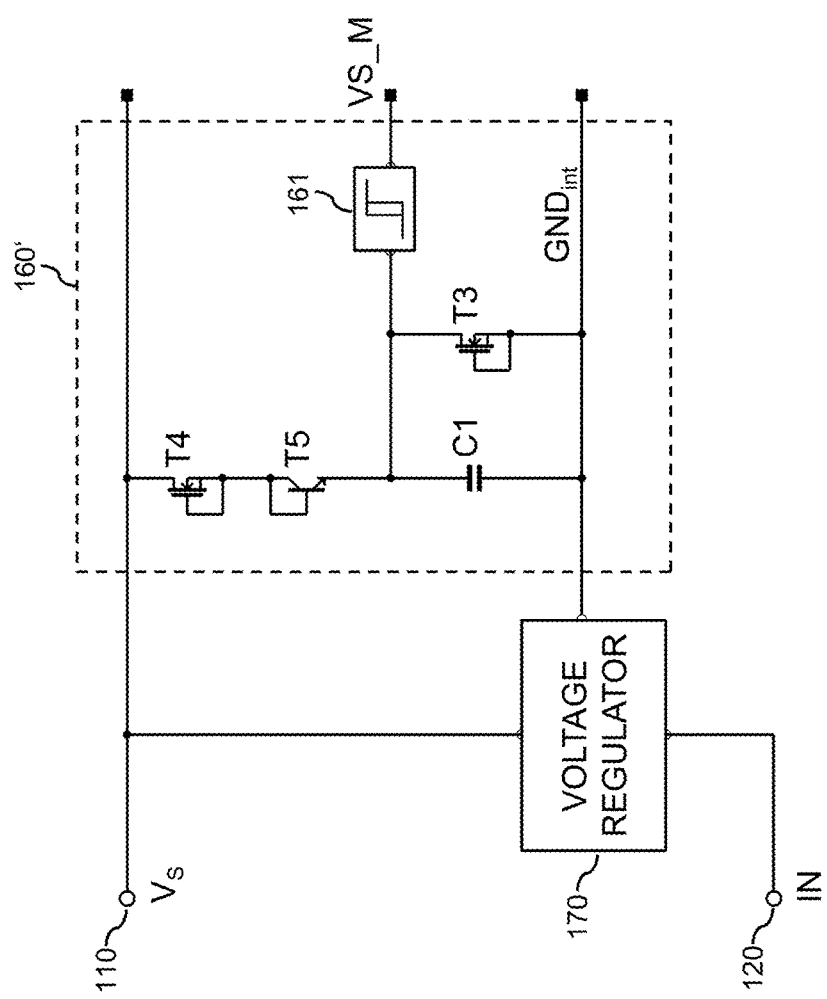
FIG. 4 schematically illustrates a further example of a storage circuit as used in a power switch device according to an embodiment of the invention.

FIG. 4 schematically illustrates a further example of a storage circuit 160' which may be used in the above-mentioned power switch device 100 for capacitively storing the status of the supply voltage. While in the previously illustrated examples it was assumed that the external voltage source directly provides the supply voltage of the power circuit, the example of FIG. 4 assumes that the power switch device 100 further includes a voltage regulator 170 which generates an internal supply voltage $V_{SI}$ from the voltage supplied through the first connection pin 110 and the second connection pin 120. As compared to the external supply voltage, the internal supply voltage $V_{SI}$ generated by the voltage regulator may for example provide a better stability and/or better matching to circuitry of the power switch device 100. In the example of FIG. 4, the voltage regulator 170 is configured to derive an internal ground potential (denoted by $GND_{int}$) from the external supply voltage. The internal supply voltage $V_{SI}$ is given by the voltage difference between the voltage $V_S$ externally supplied through the first connection pin 110 and the internal ground potential $GND_{int}$.

As illustrated, the storage circuit 160' includes a capacitor C1 and a depletion mode MOS transistor T3. The capacitor C1 and the MOS transistor T3 form an RC-circuit, where the MOS transistor T3 replaces the resistor. For this purpose, the MOS transistor T3 is operated in ohmic regime. In addition, the storage circuit 160' includes a further depletion mode MOS transistor T4 operated as a constant current source, a bipolar transistor T4 operated as a diode, and a comparator circuit, which in the illustrated example is implemented as a Schmitt trigger circuit 161. The MOS transistor T4, the bipolar transistor T5, and the capacitor C1 are connected in series between the first connection pin 110 and the internal ground potential GNDint. The MOS transistor T3 is connected in parallel to the capacitor C1.

While the second connection pin 120 is connected to ground, the capacitor C1 is charged by the internal supply voltage. In this state, a charging current of the capacitor C1 is given by a constant current provided by the MOS transistor T4. During a loss of the supply voltage $V_S$, the capacitor C1 is discharged through the MOS transistor T3. The bipolar transistor T5 prevents discharging of the capacitor C1 through other circuit paths. Assuming that the capacitor C1 was fully charged to $V_{SI}$, the time-dependent voltage of the capacitor C1 is then given by $$V_{C1}(t)=V_{SI} \cdot e^{-t/R_1 C_1}, \quad (3)$$

where R1 denotes the resistance value provided by the MOS transistor T3.

In the example of FIG. 4, the duration of the loss of the internal supply voltage can be estimated by measuring the time dependent voltage across the capacitor C1. In the case of the storage circuit 160, the voltage across the capacitor C1 at the time when the internal supply voltage returns is detected by the Schmitt trigger circuit 161. The Schmitt trigger circuit 161 compares the voltage across the capacitor C1 to the above-mentioned first threshold and, depending on the comparison, outputs a status signal VS_M. If the voltage across the capacitor C1 is above the first threshold, the status signal VS_M has a high value. Otherwise, the status signal VS_M has a low value. This status signal VS_M may then be used in a similar way as explained in connection with FIG. 3.

Figure 5:
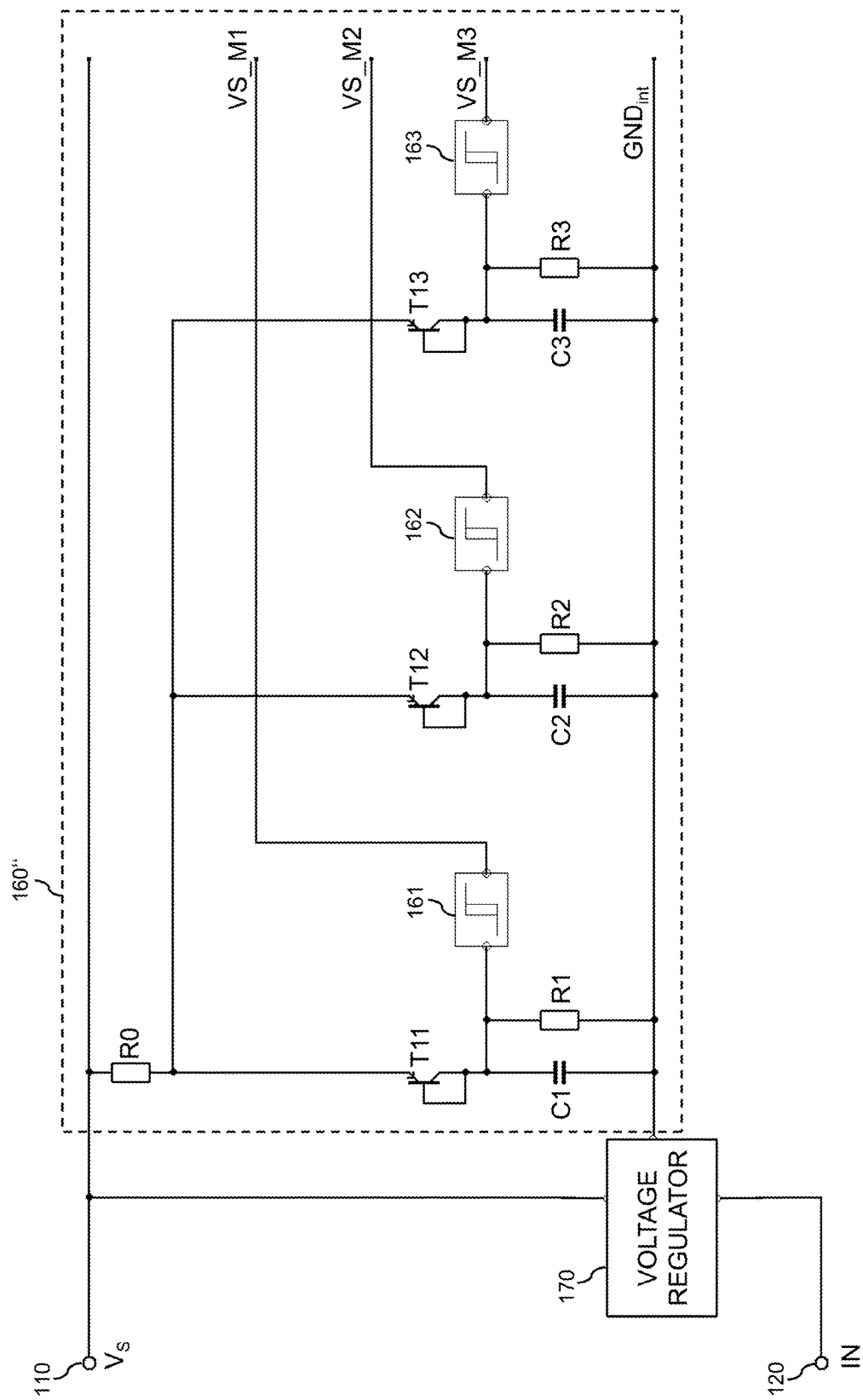
FIG. 5 schematically illustrates a further example of a storage circuit as used in a power switch device according to an embodiment of the invention.

FIG. 5 schematically illustrates a further example of a storage circuit 160" which may be used in the above-mentioned power switch device 100 for capacitively storing the status of the supply voltage. Similar to the example of FIG. 4, the example of FIG. 5 assumes that the power switch device 100 further includes a voltage regulator 170 which generates an internal supply voltage $V_{SI}$ from the voltage supplied through the first connection pin 110 and the second connection pin 120. Also the example of FIG. 5, the voltage regulator 170 is configured to derive an internal ground potential (denoted by $GND_{int}$) from the external supply voltage. The internal supply voltage $V_{SI}$ is given by the voltage difference between the voltage $V_S$ externally supplied through the first connection pin 110 and the internal ground potential $GND_{int}$.

As illustrated, the storage circuit 160" includes multiple RC circuits for capacitively storing the status of the internal supply voltage VSI with different time constants. A first RC circuit of the storage circuit 160" is formed of a first capacitor C1 and a first resistor R1, defining a first time constant $\tau_1 = R_1 \cdot C_1$. A second RC circuit of the storage circuit 160" is formed of a second capacitor C2 and a second resistor R2, defining a second time constant $\tau_2 = R_2 \cdot C_2$. A third RC circuit of the storage circuit 160" is formed of a third capacitor C1 and a third resistor R1, defining a third time constant $\tau_3 = R_3 \cdot C_3$. To obtain different values of the time constants $\tau_1, \tau_2, \tau_3$, different capacitance values $C_1, C_2, C_3$ are selected for the first capacitor C1, the second capacitor C2, and the third capacitor R3, and/or different resistance values $R_1, R_2, R_3$ are selected for the first resistor R1, the second resistor R2, and the third resistor R3. By way of example, it can be assumed that $\tau_1 < \tau_2 < \tau_3$. It is noted that the number of different RC circuits as illustrated in FIG. 5 is merely exemplary and that other numbers of RC circuits could be utilized as well, e.g., only two RC circuits or four or more RC circuits.

In addition, the storage circuit 160' includes a further resistor R0, a first bipolar transistor T11 operated as a diode, a second bipolar transistor T12 operated as a diode, and a third bipolar transistor T13 operated as a diode. Still further, the storage circuit 160' includes a first comparator circuit, which in the illustrated example is implemented as a first Schmitt trigger circuit 161, a second comparator circuit, which in the illustrated example is implemented as a second Schmitt trigger circuit 162, and a third comparator circuit, which in the illustrated example is implemented as a third Schmitt trigger circuit 163. In the case of the first RC circuit, the further resistor R0, the first bipolar transistor T11, and the first capacitor C1 are connected in series between the first connection pin 110 and the internal ground potential GNDint. The first resistor R1 is connected in parallel to the first capacitor C1. In the case of the second RC circuit, the further resistor R0, the second bipolar transistor T12, and the second capacitor C2 are connected in series between the first connection pin 110 and the internal ground potential GND-int. The second resistor R2 is connected in parallel to the second capacitor C2. In the case of the third RC circuit, the further resistor R0, the third bipolar transistor T12, and the s third capacitor C2 are connected in series between the first connection pin 110 and the internal ground potential GND-int. The third resistor R3 is connected in parallel to the third capacitor C3.

While the second connection pin 120 is connected to ground, the capacitors C1, C2, C3 are charged by the internal supply voltage. In this state, a charging current is limited by the further resistor R0. During a loss of the internal supply voltage $V_{SI}$, the first capacitor C1 is discharged through the first resistor R1, according to the time constant $\tau_1$. The bipolar transistor T11 prevents discharging of the first capacitor C1 through other circuit paths. Similarly, the second capacitor C2 is discharged through the second resistor R2, according to the time constant $\tau_2$. The bipolar transistor T12 prevents discharging of the second capacitor C2 through other circuit paths. Similarly, the third capacitor C3 is discharged through the third resistor R3, according to the time constant $\tau_3$. The bipolar transistor T13 prevents discharging of the third capacitor C3 through other circuit paths.

In the example of FIG. 5, the duration of the loss of the internal supply voltage can be estimated by measuring the time dependent voltage across the capacitors C1, C2, C3. The voltage across the first capacitor C1 at the time when the internal supply voltage returns is detected by the first Schmitt trigger circuit 161. The first Schmitt trigger circuit 161 compares the voltage across the first capacitor C1 to the above-mentioned first threshold and, depending on the comparison, outputs a first status signal VS_M1. If the voltage across the first capacitor C1 is above the first threshold, the first status signal VS_M1 has a high value. Otherwise, the first status signal VS_M1 has a low value. The voltage across the second capacitor C2 at the time when the internal supply voltage returns is detected by the second Schmitt trigger circuit 162. The second Schmitt trigger circuit 162 compares the voltage across the second capacitor C2 to the above-mentioned first threshold and, depending on the comparison, outputs a second status signal VS_M2. If the voltage across the second capacitor C2 is above the first threshold, the second status signal VS_M2 has a high value. Otherwise, the second status signal VS_M2 has a low value. The voltage across the third capacitor C3 at the time when the internal supply voltage returns is detected by the third Schmitt trigger circuit 163. The third Schmitt trigger circuit 163 compares the voltage across the third capacitor C3 to the above-mentioned first threshold and, depending on the comparison, outputs a third status signal VS_M3. If the voltage across the third capacitor C3 is above the first threshold, the third status signal VS_M3 has a high value. Otherwise, the third status signal VS_M3 has a low value.

Due to the different values of the time constants $\tau_1, \tau_2, \tau_3$, the voltage across the first capacitor C1 will first fall below the first threshold, after that the voltage across the second capacitor C2 will fall below the first threshold, and after that the voltage across the third capacitor C3 will fall below the first threshold. The values of the status signals VS_M1, VS_M2, and VS_M3 are thus indicative of the duration of the loss of the internal supply voltage. The shortest duration is indicated by all status signals VS_M1, VS_M2, and VS_M3 having the high value. The next longer duration is indicated by only the second and third status signals VS_M2 and VS_M3 having the high value. The next longer duration is indicated by only third status signal VS_M3 having the high value. The next longer duration is indicated by none of the status signals VS_M1, VS_M2, and VS_M3 having the high value. Accordingly, in addition to distinguishing between intentional disconnecting of the second connection terminal 120 from ground and unintentional voltage drops, the storage circuit 160" also enables distinguishing between different times durations of intentional disconnecting of the second connection terminal 120 from ground. This may be used for indicating various kinds of control information to the power switch device 100. For example, the control information may be used by the control logic 165 for selecting between different operating modes of the power switch device 100, e.g., a regular operating mode with the load signal in the on state, and operating mode with activated current sense functionality, and idle mode, a diagnosis mode, or the like.

Figure 6:
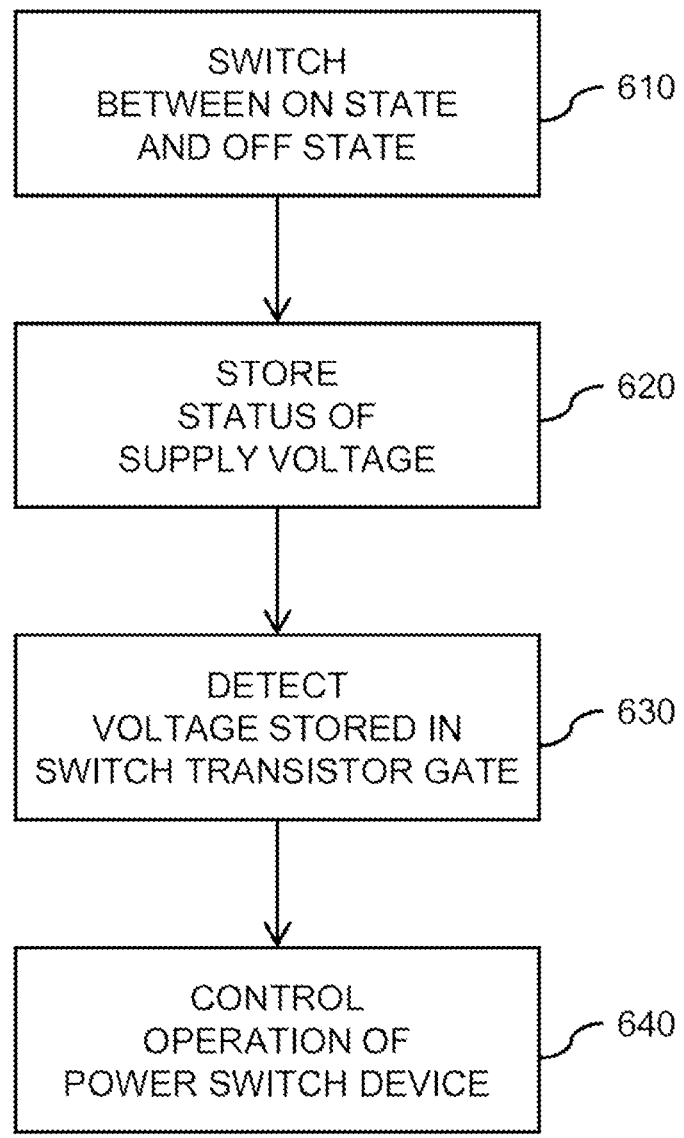
FIG. 6 shows a flowchart for schematically illustrating a method of operating a power switch device.

FIG. 6 shows a flowchart for illustrating a method which may be utilized to implement the above principles of operating a power switch device. The method of FIG. 6 may for example be applied for operating a power switch device having an architecture as illustrated in FIGS. 1 to 5. The illustrated steps, operations, all procedures of the method may be performed or controlled by a control circuit of the power switch device. An example of such control circuit is the above-mentioned control circuit 150.

At 610, the power switch device switching a load signal between an on state and an off state. A supply voltage is provided via a first terminal and a second terminal of the power switch device to the power switch device. Further, a control signal, generated by disconnecting the second terminal from an external voltage source, is provided to the power switch device. In the examples of FIGS. 1 to 5, the control signal is generated by disconnecting the second connection pin 120 from external ground. However, it is to be understood that other external voltage levels could be used instead of ground, e.g., a positive supply voltage level or a negative supply voltage level. The supply voltage may originate directly from an external voltage source or may be an internal supply voltage derived from an external supply voltage, e.g., by a voltage regulator as shown in FIG. 4 or 5.

At 620, a status of the supply voltage is capacitively stored. This may be accomplished by a storage circuit of the power switch device, such as the above-mentioned storage circuit 160, 160', or 160". Capacitively storing of the status of the supply voltage typically involves charging a capacitor while the second terminal is connected to the external voltage source and to discharging the capacitor while the second terminal is disconnected from the external voltage source. The capacitively stored status of the supply voltage may thus be represented by a time-dependent voltage across the capacitor.

According to some embodiments, the status of the supply voltage is stored by at least one resistor-capacitor circuit coupled to the supply voltage. The resistor-capacitor circuit ensures well-defined charging and discharging characteristics of the capacitor used for capacitively storing the status of the supply voltage. In some embodiments, the status of the supply voltage may be stored by multiple resistor-capacitor circuits coupled to the supply voltage. These multiple different resistor-capacitor circuits may then each have a different time constant. The multiple resistor-capacitor circuits enable an enhanced time-granularity for evaluating the capacitively stored status of the supply voltage. An example of a storage circuit with multiple resistor-capacitor circuits is explained in connection with FIG. 5.

The capacitively stored status of the supply voltage may be detected by at least one comparator circuit. Such comparator circuit may include a Schmitt trigger circuit, such as the Schmitt trigger circuits 161, 162, 163 used in the examples of FIGS. 2 to 5. By means of the comparator circuit(s), the capacitively stored status of the supply voltage at the time when the supply voltage returns after a loss may be detected and memorized in an efficient manner. Specifically, this detection of the stored status of the supply voltage may involve comparison of the stored status to a threshold.

In some embodiments, switching between the on state and the off state is accomplished by at least one transistor of the power switch device, such as the above-mentioned transistor T1. In such embodiments, also a voltage stored by a gate of the transistor may be detected.

At 640, operation of the power switch device is controlled depending on the stored status of the supply voltage. If the voltage stored by the gate was detected at 630, the operation of the power switch device may be additionally controlled depending on the detected voltage stored by the gate. In response to the second terminal being connected to the external voltage source, the power switch device may switch the load signal to the on state. In response to the second terminal being connected to the external voltage source and the stored status of the supply voltage being above a threshold, the power switch device may delay switching of the load signal to the on state. Further, the power switch device may initiate protective measures and/or diagnostic measures. If the voltage stored in the gate is detected at 630, switching between different operating modes of the power switch device may be accomplished in response to the detected voltage stored in the gate being above a threshold.

In some embodiments, the stored status of the supply voltage, may be used to distinguish between at least a first time period of disconnecting the second terminal from the external voltage source and a second time period of disconnecting the second terminal from the external voltage source. Switching between different operating modes of the power switch device may then be controlled depending on this distinguishing between at least the first time period and the second time period. A corresponding example involving distinguishing between three time periods is explained in connection with FIG. 5.

A power switch device as described herein may be applied in various fields, including the automotive field and energy technology field. Further, power switch devices as described herein could be applied in various kinds of industrial manufacturing systems or home appliances.

It is to be understood that the above-described concepts and embodiments are susceptible to various modifications. For example, the illustrated power switch devices could be implemented on the basis of various kinds of integrated circuit technology, without limitation to MOS transistor based switch devices. Further, the illustrated concepts could be applied to multi-channel power switch devices configured to switch multiple load signals. Still further, it is noted that the illustrated concepts may be applied to power switch devices having various types of terminals, without limitation to connection pins as mentioned in the examples of FIGS. 1 to 5. Still further, it is noted that the control circuit of the illustrated power switch devices may be implemented on the basis of hardwired circuitry, on the basis of programmable processor circuitry, e.g., a microcontroller, or combinations thereof.

At least some of the embodiments are defined by the examples given below:

EXAMPLE 1

A power switch device, comprising:
a switch configured to switch a load signal between an on state and an off state;
a first terminal and a second terminal configured to provide a supply voltage to the power switch device,
wherein the second terminal is further configured to provide a control signal to the power switch device, the control signal being generated by disconnecting the second terminal from an external voltage source;
a storage circuit configured to capacitively store a status of the supply voltage; and
a control circuit configured to control operation of the power switch device depending on the stored status of the supply voltage.

EXAMPLE 2

The power switch device according to example 1, wherein the control circuit is configured to:
in response to the second terminal being connected to the external voltage source, switch the load signal to the on state.

EXAMPLE 3

The power switch device according to example 1 or 2, wherein the control circuit is configured to:
in response to the second terminal being connected to the external voltage source and the stored status of the supply voltage being above a threshold, delay switching of the load signal to the on state.

EXAMPLE 4

The power switch device according to any one of the preceding examples,
wherein the switch comprises at least one transistor and the control circuit is further configured to:
in response to the second terminal being connected to the external voltage source, detect a voltage stored in a gate of the at least one transistor, and
control operation of the power switch device depending on the detected voltage stored in the gate of the at least one transistor.

EXAMPLE 5

The power switch device according to example 4, wherein the control circuit is further configured to: in response to the detected voltage stored in the gate being above a threshold, control switching between different operating modes of the power switch device.

EXAMPLE 6

The power switch device according to any one of the preceding examples,
wherein the control circuit is configured to:
based on the stored status of the supply voltage distinguish between at least a first time period of disconnecting the second terminal from the external voltage source and a second time period of disconnecting the second terminal from the external voltage source, and
depending on said distinguishing, switch between different operating modes of the power switch device.

EXAMPLE 7

The power switch device according to any one of the preceding examples,
wherein the storage circuit comprises at least one resistor-capacitor circuit coupled to the supply voltage.

EXAMPLE 8

The power switch device according to any one of the preceding examples,
wherein the storage circuit comprises multiple resistor-capacitor circuits coupled to the supply voltage, each of the multiple different resistor-capacitor circuits having a different time constant.

EXAMPLE 9

The power switch device according to any one of the preceding examples, wherein the storage circuit comprises at least one comparator circuit configured to detect the stored status of the supply voltage.

EXAMPLE 10

The power switch device according to any one of the preceding examples,
wherein the storage circuit is configured to charge a capacitor while the second terminal is connected to the external voltage source and to discharge the capacitor while the second terminal is disconnected from the external voltage source.

EXAMPLE 11

A method of operating a power switch device, comprising:
a power switch device switching a load signal between an on state and an off state, a supply voltage being provided via a first terminal and a second terminal of the power switch device to the power switch device;
providing a control signal to the power switch device, the control signal being generated by disconnecting the second terminal from an external voltage source;
capacitively storing a status of the supply voltage; and
controlling operation of the power switch device depending on the stored status of the supply voltage.

EXAMPLE 12

The method according to example 11, comprising:
in response to the second terminal being connected to the external voltage source, the power switch device switching the load signal to the on state.

EXAMPLE 13

The method according to example 11 or 12, comprising:
in response to the second terminal being connected to the external voltage source and the stored status of the supply voltage being above a threshold, the power switch device delaying switching of the load signal to the on state.

EXAMPLE 14

The method according to any one of examples 11-13,
wherein said switching between the on state and the off state is accomplished by at least one transistor of the power switch device and the method further comprises:
in response to the second terminal being connected to the external voltage source, detecting a voltage stored in a gate of the at least one transistor, and
controlling operation of the power switch device depending on the detected voltage stored in the gate of the at least one transistor.

EXAMPLE 15

The method according to example 14, comprising:
in response to the detected voltage stored in the gate being above a threshold, switching between different operating modes of the power switch device.

EXAMPLE 16

The method according to any one of examples 11-15, comprising:
based on the stored status of the supply voltage, distinguishing between at least a first time period of disconnecting the second terminal from the external voltage source and a second time period of disconnecting the second terminal from the external voltage source, and depending on said distinguishing, controlling switching between different operating modes of the power switch device.

EXAMPLE 17

The method according to any one of examples 11-16, comprising:
storing the status of the supply voltage by at least one resistor-capacitor circuit coupled to the supply voltage.

EXAMPLE 18

The method according to any one of examples 11-17, comprising:
storing the status of the supply voltage by multiple resistor-capacitor circuits coupled to the supply voltage, each of the multiple different resistor-capacitor circuits having a different time constant.

EXAMPLE 19

The method according to any one of examples 11-18, comprising:
detecting the stored status of the supply voltage by at least one comparator trigger circuit.

EXAMPLE 20

The method according to any one of examples 11-19, comprising:
charging a capacitor while the second terminal is connected to the external voltage source and to discharging the capacitor while the second terminal is disconnected from the external voltage source.

What is claimed is:
1. A power switch device comprising:
a switch configured to switch a load signal between an on state and an off state;
a first external terminal and a second external terminal configured to provide a supply voltage to the power switch device, wherein the second external terminal is further configured to provide a control signal to the power switch device, the control signal being generated by disconnecting the second external terminal from an external voltage source;
a storage circuit configured to capacitively store a status of the supply voltage; and
a control circuit configured to control operation of the power switch device depending on the stored status of the supply voltage.
2. The power switch device according to claim 1, wherein the control circuit is configured to, in response to the second external terminal being connected to the external voltage source, switch the load signal to the on state.
3. The power switch device according to claim 1, wherein the control circuit is configured to, in response to the second external terminal being connected to the external voltage source and the stored status of the supply voltage being above a threshold, delay switching of the load signal to the on state.

4. The power switch device according to claim 1, wherein the switch comprises at least one transistor, and wherein the control circuit is further configured to:
 in response to the second external terminal being connected to the external voltage source, detect a voltage stored in a gate of the at least one transistor, and
 control operation of the power switch device depending on the detected voltage stored in the gate of the at least one transistor.

5. The power switch device according to claim 4, wherein the control circuit is further configured to, in response to the detected voltage stored in the gate being above a threshold, control switching between different operating modes of the power switch device.

6. The power switch device according to claim 1, wherein the control circuit is configured to:
 based on the stored status of the supply voltage, distinguish between at least a first time period of disconnecting the second external terminal from the external voltage source and a second time period of disconnecting the second external terminal from the external voltage source, and
 depending on said distinguishing, switch between different operating modes of the power switch device.

7. The power switch device according to claim 1, wherein the storage circuit comprises at least one resistor-capacitor circuit coupled to the supply voltage.

8. The power switch device according to claim 1, wherein the storage circuit comprises multiple resistor-capacitor circuits coupled to the supply voltage, each of the multiple different resistor-capacitor circuits having a different time constant.

9. The power switch device according to claim 1, wherein the storage circuit comprises at least one comparator circuit configured to detect the stored status of the supply voltage.

10. The power switch device according to claim 1, wherein the storage circuit is configured to charge a capacitor while the second external terminal is connected to the external voltage source and to discharge the capacitor while the second external terminal is disconnected from the external voltage source.

11. A method of operating a power switch device, the method comprising:
 a power switch device switching a load signal between an on state and an off state, a supply voltage being provided via a first external terminal and a second external terminal of the power switch device to the power switch device;
 providing a control signal to the power switch device, the control signal being generated by disconnecting the second external terminal from an external voltage source;
 capacitively storing a status of the supply voltage; and
 controlling operation of the power switch device depending on the stored status of the supply voltage.

12. The method according to claim 11, further comprising, in response to the second external terminal being connected to the external voltage source, the power switch device switching the load signal to the on state.

13. The method according to claim 11, further comprising, in response to the second external terminal being connected to the external voltage source and the stored status of the supply voltage being above a threshold, the power switch device delaying switching of the load signal to the on state.

14. The method according to claim 11, wherein said switching between the on state and the off state is accomplished by at least one transistor of the power switch device, and the method further comprises:
 in response to the second external terminal being connected to the external voltage source, detecting a voltage stored in a gate of the at least one transistor, and
 controlling operation of the power switch device depending on the detected voltage stored in the gate of the at least one transistor.

15. The method according to claim 14, further comprising, in response to the detected voltage stored in the gate being above a threshold, switching between different operating modes of the power switch device.

16. The method according to claim 11, further comprising:
 based on the stored status of the supply voltage, distinguishing between at least a first time period of disconnecting the second external terminal from the external voltage source and a second time period of disconnecting the second external terminal from the external voltage source, and
 depending on said distinguishing, controlling switching between different operating modes of the power switch device.

17. The method according to claim 11, further comprising storing the status of the supply voltage by at least one resistor-capacitor circuit coupled to the supply voltage.

18. The method according to claim 11, further comprising storing the status of the supply voltage by multiple resistor-capacitor circuits coupled to the supply voltage, each of the multiple different resistor-capacitor circuits having a different time constant.

19. The method according to claim 11, further comprising detecting the stored status of the supply voltage by at least one comparator trigger circuit.

20. The method according to claim 11, further comprising charging a capacitor while the second external terminal is connected to the external voltage source and to discharging the capacitor while the second external terminal is disconnected from the external voltage source.

* * * * *